United States Patent
Carpenter, Jr. et al.

(10) Patent No.: US 9,721,742 B1
(45) Date of Patent: Aug. 1, 2017

(54) POWER INTEGRATED CIRCUIT WITH AUTONOMOUS LIMIT CHECKING OF ADC CHANNEL MEASUREMENTS

(71) Applicant: Active-Semi, Inc., Tortola (VG)

(72) Inventors: John H. Carpenter, Jr., Allen, TX (US); Brett E. Smith, McKinney, TX (US); Hiroshi Watanabe, Tokyo (JP)

(73) Assignee: Active-Semi, Inc. (VG)

( * ) Notice: Subject to any disclaimer, the term of this patent is extended or adjusted under 35 U.S.C. 154(b) by 0 days.

(21) Appl. No.: 15/201,233

(22) Filed: Jul. 1, 2016

Related U.S. Application Data

(60) Provisional application No. 62/354,732, filed on Jun. 25, 2016, provisional application No. 62/354,733, filed on Jun. 25, 2016, provisional application No. 62/354,734, filed on Jun. 25, 2016, provisional application No. 62/354,738, filed on Jun. 25, 2016, provisional application No. 62/354,740, filed on Jun. 25, 2016, provisional application No. 62/354,741, filed on Jun. 25, 2016, provisional application No. 62/357,739, filed on Jul. 1, 2016.

(51) Int. Cl.
*H01H 85/00* (2006.01)
*H01H 85/02* (2006.01)
*H02J 9/06* (2006.01)
*H03M 1/12* (2006.01)

(52) U.S. Cl.
CPC ......... *H01H 85/0241* (2013.01); *H02J 9/061* (2013.01); *H03M 1/12* (2013.01)

(58) Field of Classification Search
None
See application file for complete search history.

(56) References Cited

U.S. PATENT DOCUMENTS 7,224,633 B1 * 5/2007 Hovis .................... G11C 17/18
365/207

* cited by examiner

*Primary Examiner* — Cassandra Cox
(74) *Attorney, Agent, or Firm* — Imperium Patent Works; T. Lester Wallace

(57) ABSTRACT

A power loss protection integrated circuit includes a current switch circuit portion (eFuse) and an autonomous limit checking circuit. The limit checking circuit includes an input analog multiplexer, an ADC, a plurality of capture registers, a state machine, and a flag output terminal. For each capture register, the limit checking circuit further includes an associated lower limit register and an associated upper limit register. The state machine controls the multiplexer and the capture registers so the ADC digitizes voltages on various nodes to the monitored, and stores the results into corresponding capture registers. In integrated circuit has circuitry that allows both a high voltage as well as a high current to be monitored. The value in a capture register is compared to upper and lower limit values. If any capture value is determined to be outside the limits, then a digital flag signal is asserted onto the flag output terminal.

22 Claims, 12 Drawing Sheets

COMPARE-AND-MASK CIRCUIT

DAC AND COMPARE CIRCUIT

STATE DIAGRAM FOR THE CAPACITOR HEALTH
MONITOR STATE MACHINE

| TSET[3:0] | MILLISECONDS |
|---|---|
| 0000 | 2 |
| 0001 | 4 |
| 0010 | 8 |
| 0011 | 16 |
| 0100 | 32 |
| 0101 | 64 |
| 0110 | 128 |
| 0111 | 256 |
| 1000 | 384 |
| 1001 | 512 |
| 1010 | 640 |
| 1011 | 768 |
| 1100 | 896 |
| 1101 | 1024 |
| 1110 | 1152 |
| 1111 | 1280 |

TSET LOOKUP TABLE

CAPACITOR HEALTH CHECK

SWITCHING CONVERTER CONTROL CIRCUIT

VOLTAGE REFERENCE CIRCUIT

I2C INTERFACE AND DIGITAL REGISTER CONTROL AND DIGITAL STATE MACHINE

US 9,721,742 B1

POWER INTEGRATED CIRCUIT WITH AUTONOMOUS LIMIT CHECKING OF ADC CHANNEL MEASUREMENTS

CLAIM OF PRIORITY UNDER 35 U.S.C. §119

This application claims the benefit under 35 U.S.C. §119 of each of the following six U.S. Provisional Applications: 1) U.S. Provisional Application Ser. No. 62/354,732, entitled "POWER INTEGRATED CIRCUIT WITH AUTONOMOUS LIMIT CHECKING OF ADC CHANNEL MEASUREMENTS," filed Jun. 25, 2016; 2) U.S. Provisional Application Ser. No. 62/354,733, entitled "POWER LOSS PROTECTION INTEGRATED CIRCUIT," filed Jun. 25, 2016; 3) U.S. Provisional Application Ser. No. 62/354,734, entitled "AUTONOMOUS CAPACITOR HEALTH CHECK IN A POWER LOSS PROTECTION INTEGRATED CIRCUIT," filed Jun. 25, 2016; 4) U.S. Provisional Application Ser. No. 62/354,738, entitled "PROGRAMMABLE VOLTAGE SETTING WITH OPEN AND SHORT CIRCUIT PROTECTION," filed Jun. 25, 2016; 5) U.S. Provisional Application Ser. No. 62/354,740, entitled "OPTIMIZED GATE DRIVER FOR LOW VOLTAGE POWER LOSS PROTECTION SYSTEM," filed Jun. 25, 2016; 6) U.S. Provisional Application Ser. No. 62/354,741, entitled "FAST SETTLEMENT OF SUPPLEMENT CONVERTER FOR POWER LOSS PROTECTION SYSTEM," filed Jun. 25, 2016, and 7) U.S. Provisional Application Ser. No. 62/357,739, entitled "GATE DRIVER TO DECREASE EMI WITH SHORTER DEAD-TIME," filed Jun. 25, 2016. The entire subject matter of each of the six above-listed provisional applications is incorporated herein by reference.

TECHNICAL FIELD

The present disclosure relates generally to power loss protection systems, and to related circuits and methods.

BACKGROUND INFORMATION

Capacitors and/or batteries are used to store energy in power loss protection systems. FIG. 1 (Prior Art) illustrates one example of a power loss protection system 200 involving a so-called "eFuse" 201, a switch component 202, enable trip point resistors 203 and 204, a boost converter circuit 205, a bank of capacitors and/or batteries 206, and a voltage regulator 207. This circuitry is soldered onto a printed circuit board. During normal operation of the system, the boost converter 201 receives some of the power from the eFuse output and uses that to charge the capacitors and/or batteries 202. If VIN at input 203 is then suddenly lost, for example due to a condition like a power brown out condition or a power cord disconnection event, then the eFuse turns off immediately and the fault signal is asserted. The fault signal is received by the second switch SW2 202. The second switch SW2 202 responds by turning on so that power can then be supplied onto node 208 from the capacitors and/or batteries 202 in the place of the lost power. The linear voltage regulator 207 reduces the capacitor voltage down to the supply voltage "VSYS" required by the device being powered. The required system power and supply voltage VSYS can therefore be maintained for long enough to allow data that is stored in the device in volatile memory to be transferred into non-volatile storage before system power is lost altogether. This kind of prior art power loss protection system is used to power devices where high reliability is required, such as in computers like laptops and servers. If capacitors are used for block 206, then the capacitance of the capacitors must be large enough that the energy stored in the capacitors can sustain system power long enough to allow the device to complete a safe power-off sequence involving backup of configuration information and status after a loss of VIN is detected. The capacitors are sized accordingly to account for anticipated system operation and the needs of the device being powered.

SUMMARY

In a power loss protection system as described above in the background information section, in which capacitors and not batteries are used for block 202, one or more of the capacitors of block 202 may degrade for various reasons. In other systems of the very same type, the corresponding capacitors do not degrade. Due to the degradation, the capacitor or capacitors may have a smaller capacitance. When the power loss protection system is needed in a power loss event, the remainder of the circuit works but there may be inadequate energy stored due to the lower than required capacitance where the backup energy is stored.

In a first novel aspect, a power loss protection integrated circuit includes a current switch circuit portion (that can perform the eFuse function) and an autonomous limit checking circuit. The autonomous limit checking circuit includes an input analog multiplexer, an Analog-to-Digital Converter (ADC), a plurality of capture registers, a digital state machine, and a flag output terminal. For each capture register, the autonomous limit checking circuit further includes an associated lower limit register and an associated upper limit register. The digital state machine controls the input analog multiplexer and the capture registers so the ADC digitizes a voltage on a first of a plurality of nodes to be monitored. The digitized value from the ADC is then stored under control of the digital state machine in a corresponding first one of the capture registers. After this capture event, the digital state machine controls the input analog multiplexer and the capture registers so that the ADC digitizes a voltage on a second one of a plurality of nodes, and the resulting second digitized value is then stored in a corresponding second one of the capture registers. One by one, the voltages on the various nodes to be monitored are digitized, and the resulting digital capture values are stored one by one into the corresponding ones of the capture registers. The capture value in each capture register is compared to a upper limit value stored in the associated upper limit register and is also compared to a lower limit value stored in the associated lower limit register. These comparisons may be masked. A digital value indicative of a result of the comparisons is obtained. In one example, the digital value is true if the capture value is smaller than the lower limit value or is greater than the upper limit value. If any of these digital values for any of the capture registers is asserted, then a flag signal indicative of this condition is output onto the flag output terminal. This capturing and comparing operation of the limit checking circuit is "autonomous" from any associated digital processor or microcontroller that might be coupled to the integrated circuit in that once it is set up, it operates autonomously. The power loss protection integrated circuit is a power integrated circuit device that includes rugged power transistors and circuitry in its current switch portion that are not found in typical purely digital logic integrated circuits. In one example, a node voltage that is monitored can have a voltage that is substantially higher than the supply voltage that powers the digital logic circuitry on the power loss protection integrated circuit. For example, a twenty volt node voltage may be monitored and a capture value obtained that is indicative of the magnitude of this voltage, whereas the digital logic circuitry is powered from a VDD supply voltage of five volts or less. In addition, the power loss protection includes a current sense circuitry that allows the monitoring of a large through-current flowing through the current switch circuit. This through-current (for example, a constant two amperes) is much larger than the typical small currents that would ordinarily be monitored by a discrete ADC. The ADC is capable of monitoring the magnitude of this large through-current. Advantageously, the power loss protection integrated circuit includes no processor that fetches, decodes and executes any instructions. The limit checking circuit can operate autonomously of any such processor. Associated with each limit register is a corresponding register of non-volatile memory, such as FLASH. These non-volatile registers are preloaded with data at the time of integrated circuit device manufacture by the integrated circuit manufacturer and supplier. The very same type of power loss protection integrated circuit that is used in a larger circuit involving a processor can also be used in another customer's system that has no processor. Upon power up and/or at another suitable time, the pre-loaded content of each non-volatile register is automatically loaded into its associated limit register. In one case, the flag output terminal is usable to supply an interrupt signal to a processor, such as a microcontroller of the device being powered. In another case, the flag output terminal is usable to drive a LED that gives a visible indication of a detected limit situation in a case where the user's system might have no processor.

In a second novel aspect, a single power loss protection integrated circuit includes a current switch circuit (that can perform the eFuse function), an input voltage terminal (VIN), an output voltage terminal (VOUT), a buck/boost controller, and a storage capacitor terminal (STR). The buck/boost controller is adapted to work, along with discrete components external to the integrated circuit such as a discrete inductor, as either a buck converter in a buck mode of operation, or as a boost converter in a boost mode of operation. The same external inductor is used as the inductor in both modes. In the boost mode, the buck/boost controller drives a switch terminal so that the buck/boost controller in combination with the external inductor receives a relatively low voltage as output by the current switch circuit (the eFuse) and outputs a relatively high voltage onto the storage capacitor terminal (STR) thereby charging any external capacitor coupled to this terminal. In the buck mode, the buck/boost controller receives the relatively high voltage from the storage capacitor terminal (STR) and bucks it down to the relatively low voltage that is required at the output voltage terminal VOUT by the device to be powered. The current switch circuit in performing its eFuse function can pass a through-current of up to a maximum current from the input voltage terminal VIN to the output voltage terminal VOUT, where this maximum input current is a large current of at least two amperes. The through-current is large as compared to currents that typically pass through digital logic circuits. The current switch circuit outputs a digital undervoltage signal and a digital high current signal. The digital undervoltage signal (UV), if asserted, indicates that the input voltage on the VIN terminal is lower than a predetermined voltage. The digital high current signal (HC), if asserted, indicates that the through-current is greater than a predetermined current. If the digital undervoltage signal UV is asserted, then the buck/boost converter is made to begin operating in the buck mode. If the digital high current signal HC is asserted, then the buck/boost converter is prevented from operating in the boost mode. Advantageously, the intercommunication of the necessary signals between the current switch circuit portion of the integrated circuit and the buck/boost controller portion of the integrated circuit to accomplish these conditional disabling functions are on the integrated circuit. This allows the signaling to be fast, and allows the signals to be lower power signals because the environment on-chip is relatively free of potential noise problems that otherwise might be present were the intercommunication to have to pass across conductors on a printed circuit board. Potential board level complexities and noise problems are avoided. The speed and efficiency of the intercommunication allows the size of the storage capacitor bank for a given application to be made smaller and less expensive because the buck/boost converter is controlled faster in a fault condition as compared to a prior art situation as illustrated in FIG. 1 of the background information section.

In a third novel aspect, a power loss protection integrated circuit includes a storage capacitor terminal (STR), a novel autonomous capacitor health check circuit, and a capacitor fault terminal (CF). The novel autonomous capacitor health check circuit is "autonomous" in that it can be set up to operate autonomously of any instruction fetching and executing processor as described above in connection with the autonomous limit checking circuit. The capacitor health check circuit performs a periodic capacitor check operation by sinking a predetermined current from the storage capacitor terminal for a predetermined time duration. During the predetermined time duration it detects whether the voltage on the storage capacitor terminal STR drops below a predetermined threshold voltage. If the voltage on the storage capacitor terminal STR is detected to have dropped below the predetermined threshold voltage, then a sequential logic element in the capacitor health check circuit is set, and this in turn causes a digital logic capacitor fault signal CF to be asserted onto the capacitor fault terminal CF. Immediately following the capacitor health check operation, a buck/boost controller portion of the integrated circuit may again operate in a boost mode so that a charging voltage is again driven onto the storage capacitor terminal (STR), thereby recharging the external storage capacitor back up to its initial, fully charged, voltage. Such a capacitor health check operation is carried out periodically by the capacitor health check circuitry without having to be repeatedly prompted to do such a check by any digital processor. In one example, the power loss protection integrated circuit includes a buck/boost controller as discussed above. The capacitor health check circuit outputs a digital control signal that disables the controller from operating when a capacitor health check operation is occurring. In one example, the predetermined time duration actually involves a first time portion and a second time portion. During the first time portion, a first predetermined and fixed current is "sinked" from (drawn from to a current sink) the STR terminal. During the second time portion, a second predetermined and fixed current is sinked from the STR terminal. After the capacitor health check operation is completed, the overall power loss protection integrated circuit automatically resumes operating in its normal mode. The first time portion of the test is tailored to detect a first failure characteristic of a degraded capacitor, and the second time portion of the test is tailored to detect a second failure characteristic of a degraded capacitor. In one example, an external processor can detect whether the sequential logic element of the capacitor health check circuit has been set or not. The external processor does this by reading a register of the integrated circuit through a serial digital bus interface. If a bit in this register is read as having been set, this indicates to the processor that the sequential logic element of the capacitor health check circuit was set. The reading of the register causes the sequential logic element to be reset. The very same type of power loss protection integrated circuit is usable both with a digital processor that can read the register, and without such a processor. In one example, after a certain amount of time has elapsed, the sequential logic element of the health check circuit is automatically reset regardless of whether the register was read or not. In one example, there are various modes for how the capacitor fault signal is communicated out of the integrated circuit, and how the sequential logic element is reset. There is a default mode. The mode used at a give time can be changed by an external processor by writing to a control register on the integrated circuit via the serial bus interface.

The foregoing is a summary and thus contains, by necessity, simplifications, generalizations and omissions of detail; consequently is it appreciated that the summary is illustrative only. Still other methods, and structures and details are set forth in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 2A and FIG. 2B together form the larger diagram of FIG. 2.

DETAILED DESCRIPTION

Figure 2A:
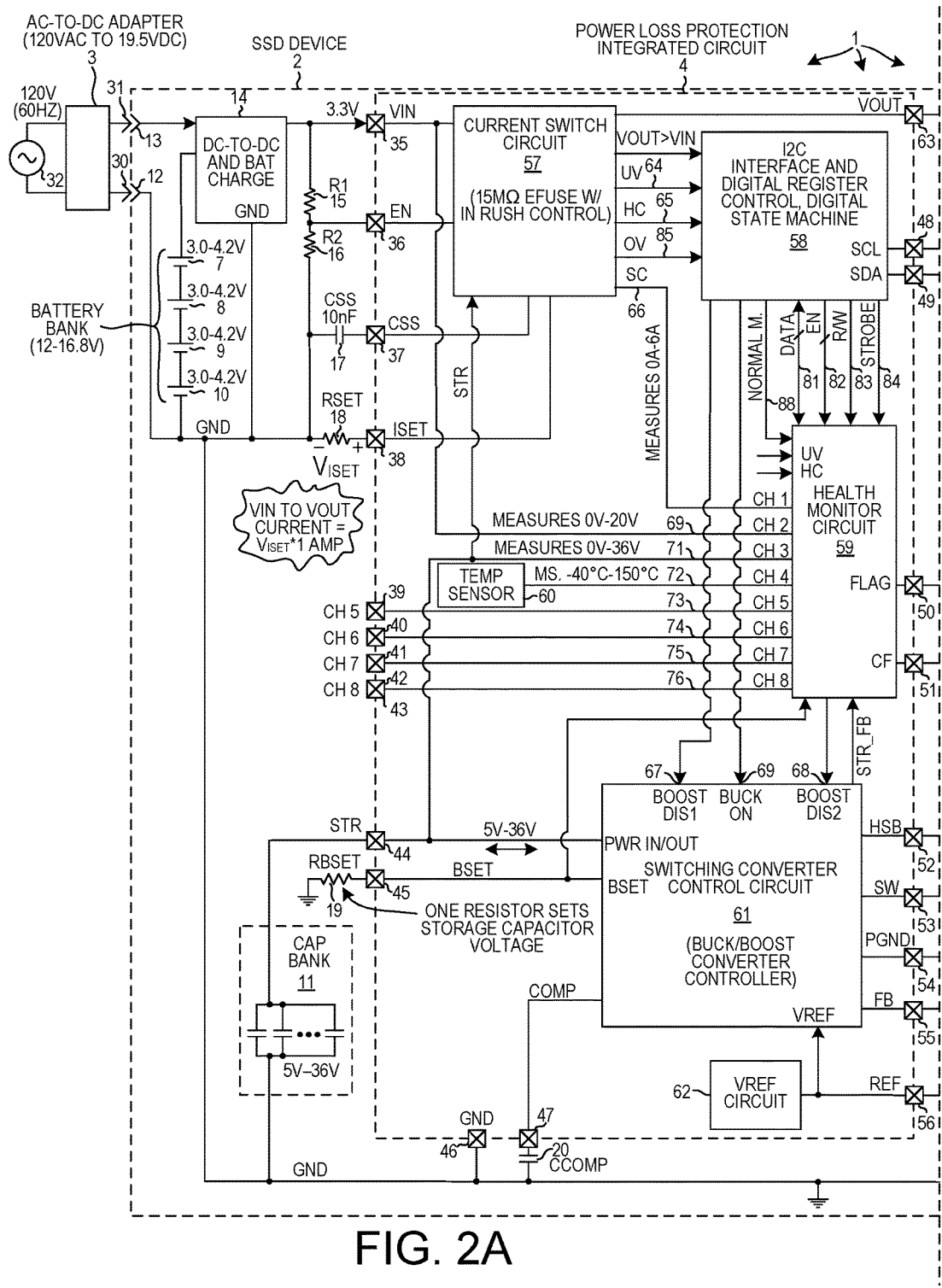
FIG. 2A is a first part of a larger diagram of a system involving a novel power loss protection integrated circuit.
Figure 2B:
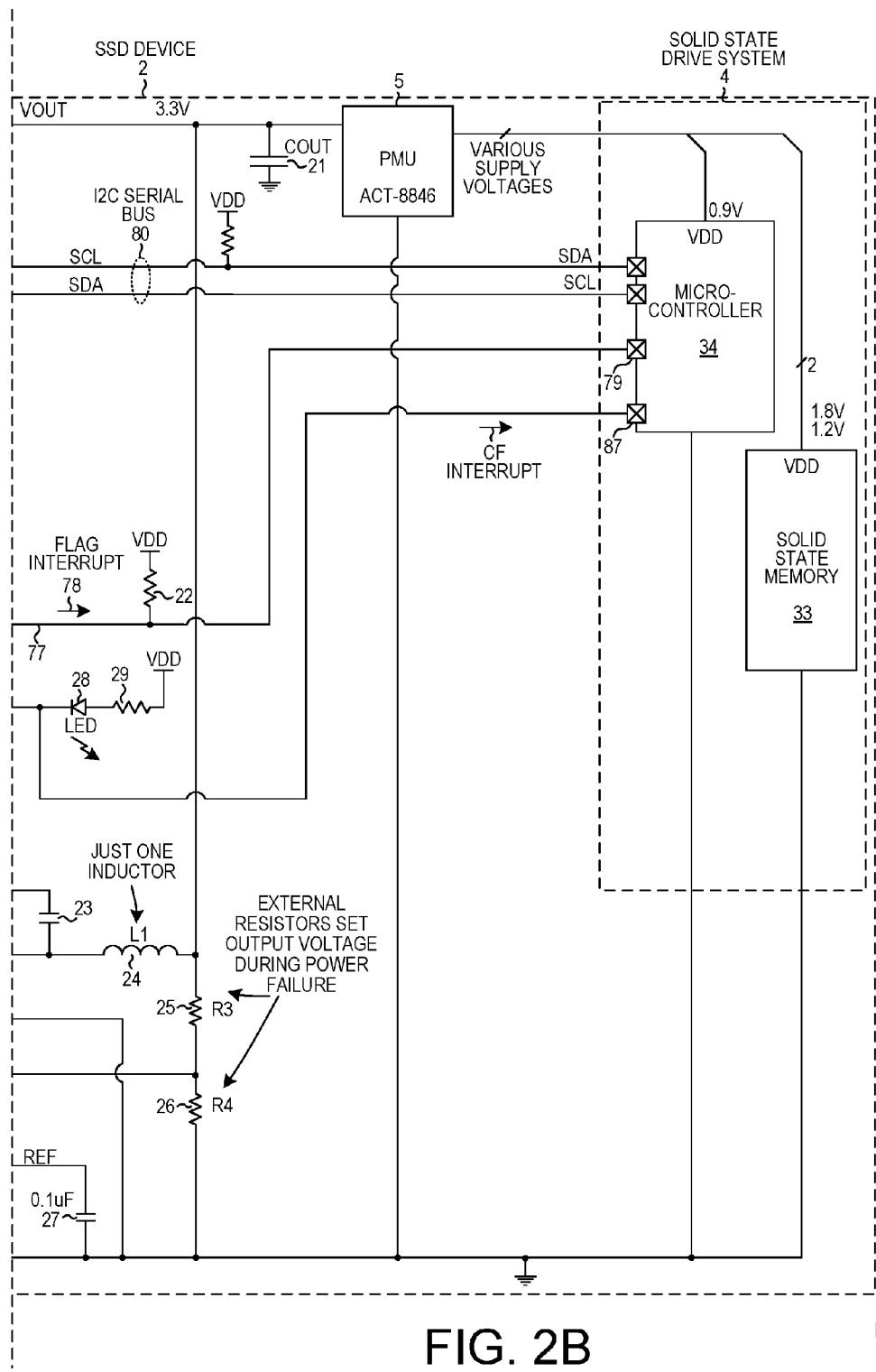
FIG. 2B is a second part of a larger diagram of a system involving a novel power loss protection integrated circuit.

FIG. 2 is a diagram of a system 1 that involves a device to be powered 2 and an AC-to-DC adapter 3. The device 2 in this particular example is a Solid State Drive (SSD) device. It includes a solid state device system 4, a Power Management Unit (PMU) integrated circuit 5, a power loss protection integrated circuit 6, a bank of series-connected batteries 7-10, a bank of parallel-connected capacitors 11, a socket portion 12 and 13 of a connector, a DC-to-DC converter and battery charger 14, and other discrete components 15-29. The solid state drive system 4 includes, among other components not shown, a solid state memory portion 33 and a microcontroller integrated circuit 34. The AC-to-DC adapter 3 can be connected to the SSD device 2 by plugging its plug portion 30 and 31 into the socket portion 12 and 13 of the SSD device, and the AC-to-DC adapter 3 can be disconnected from the SSD device by unplugging it from the socket portion. The AC-to-DC adapter 3 is coupled to receive power from a 120 volt RMS VAC 60 Hz supply voltage source 32 such as, for example, a standard residential wall socket. The SSD device 2 further includes a printed circuit board (not shown) disposed within an enclosure (not shown). The integrated circuits and other components of the SSD device 2 are mounted to the PCB and are contained in the enclosure.

Power loss protection integrated circuit 6 includes a VIN terminal 35, an EN terminal 36, a CSS terminal 37, an ISET terminal 38, several analog input terminals 39-43, a STR terminal 44, a BSET terminal 45, a ground terminal GND 46, a CCOMP terminal 47, a VOUT terminal 63, an SCL terminal 48, a SDA terminal 49, a flag output terminal 50, a capacitor flat terminal CF 51, an HSB terminal 52, a SW terminal 53, a PGND terminal 54, an FB terminal 55, a REF terminal 56, a current switch circuit 57, an I2C interface and digital register control and digital state machine circuit 58, a health monitor circuit 59, an on-chip temperature sensor 60, a buck/boost switching converter control circuit 61, and a reference voltage circuit 62.

The current switch circuit 57 is also called an eFuse circuit. The current switch circuit 57 can couple the VIN terminal 35 to the VOUT terminal 63 such that current can freely flow from the VIN terminal 35, through the current switch circuit 57, and to the VOUT terminal 63. When the current switch circuit 57 is ON in this way, it only introduces a 15 milliohm resistance in that current path. The current switch circuit 57 monitors the voltage on the VIN terminal. If the voltage on the VOUT terminal 63 is greater than the voltage on the VIN terminal 35, then the switch circuit 57 asserts the VOUT>VIN digital signal on conductor 86 to a digital logic high, otherwise the VOUT>VIN digital signal is a digital logic low. If the voltage on the VIN terminal is below an undervoltage value set by resistors 15 and 16, then the current switch circuit 57 is OFF such that the VIN terminal is not coupled to the VOUT terminal through the switch circuit 57. If the current switch circuit 57 detects the "UV" undervoltage condition, then it asserts the UV digital signal on conductor 64 to a digital logic high, otherwise the UV digital signal is a digital logic low. If the voltage on the VIN terminal is above a programmable overvoltage value, then the current switch circuit 57 is OFF such that the VIN terminal is not coupled to the VOUT terminal through the switch circuit 57. If the current switch 57 detects the "OV" overvoltage condition, then it asserts the OV digital signal on the OV conductor 85.

In addition to sensing voltages, the current switch circuit 57 also senses the magnitude of current flowing through the current switch between the VIN terminal and the VOUT terminal. If the current is below a predetermined high current value ($A_{HC}$), and if the current switch 57 is to be ON as determined by the voltage on the VIN terminal, then the current switch is fully ON (to have a resistance of 15 milliohms or less). If, however, the current is detected to reach the high current value ($A_{HC}$), then the current switch circuit begins to regulate the through-current so that the through-current remains at the high current value amount $A_{HC}$ but does not exceed $A_{HC}$. The current switch 57 does this by controlling the gate voltages on a pair of series field effect transistors through which the through-current flows. Increasing the drain-to-source resistance $R_{DS}$ of these field effect transistors allows the flow of current to be maintained at the $A_{HC}$ amount. If, however, the $R_{DS}$ across the transistors becomes too high, or if the voltage on the VOUT terminal decreases too much, then the field effect transistors are not linearly regulated by controlling their $R_{DS}$ resistances, but rather the field effect transistors are turned on and off repeatedly with a duty cycle. The duty cycle is regulated in an attempt to limit the power dropped in the current switch circuit 57. In this way, the current switch circuit 57 serves a function of limiting the magnitude of a possible large inrush current (inrush power) that might otherwise flow into the system when the SSD device is initially plugged into the AC-to-DC adapter 3 when the storage capacitors 11 are fully discharged and when the COUT capacitor 21 is fully discharged. In the present example, the inrush current limit set by the resistance of resistor RSET 18 is a current (for example, two amperes) that is larger than a typical digital logic or analog signaling input terminal or output terminal could handle.

The CSS capacitor 17 slows down the start up slew rate of the current switch circuit 57, thereby providing a "soft start" operation. The board designer can select the capacitance value of the CSS capacitor to tailor the start up slew rate as desired. If left open, the startup slew rate defaults to one millivolt per microsecond. The high current value ($A_{HC}$) is set by setting the resistance value of resistor RSET 18. The high current value $A_{HC}$ is roughly equal to one volt divided by the RSET value in ohms. If the current switch circuit 57 detects the "HC" high current condition, then it asserts the HC digital signal on conductor 65 to digital logic high, otherwise the HC digital signal is a digital logic low. The current switch circuit 57 includes a current sensor/mirror that provides a small auxiliary current flow whose magnitude is proportional to the magnitude of the main current flow through the current switch circuit 57 from the VIN terminal to the VOUT terminal. This small mirrored auxiliary current is converted into a voltage signal by making the current flow across the RSET resistor 18. The resulting voltage signal, whose magnitude is proportional to the current flow through the switch circuit 57, is output from the current switch circuit 57 via the switch current (SC) conductor 66. The voltage signal on the switch current SC conductor 66 is indicative of the magnitude of the current flowing through the current switch 57.

The buck/boost switching converter control circuit 61, together with external components 20, 21 and 23-27 is operable as a buck switching converter or as a boost switching converter. When it is operating in a boost mode, the converter receives a relatively low voltage from the VOUT terminal, and outputs a boosted up relatively high voltage onto the STR terminal 44. In one example, the voltage on the VOUT terminal is 3.3 volts DC, and the voltage that the converter drives onto the STR terminal 44 is 36 volts DC. This relatively high voltage serves to charge the capacitor bank 11 capacitors up to 36 volts. The magnitude of this charging voltage is set by the value of the RBSET resistor 19. When the converter is operating in a buck mode, the converter receives a relatively high voltage from the STR terminal 44, and outputs a bucked down relatively low voltage onto the VOUT terminal 63. In one example, the voltage on the STR terminal 44 is 36 volts (as set by the RBSET resistor), and the voltage that the converter drives onto the VOUT terminal is 3.3 volts DC. The buck/boost switching converter control circuit 61 has an active high boost disable digital signal input lead BOOST_DIS1 67 and another active high boost disable digital input lead BOOST_DIS2 68. If a digital logic high signal is present on either of these inputs, then the converter is prevented (disabled) from operating in the boost mode. The buck/boost switching converter control circuit 58 also has an active high digital signal input lead BUCK ON 69. If a digital logic high signal is present on this input 69, then the converter is made to start operating in the buck mode.

The health monitor circuit 59 includes an eight-channel sigma-delta Analog-to-Digital Converter (ADC), a set of compare-and-mask circuits, and a digital state machine. The health monitor circuit 59 autonomously monitors the voltages on eight input conductors 66, 69, and 71-76 (8 channels). If any one of these voltages is detected to be below a corresponding lower voltage limit or is detected to be above a corresponding upper voltage limit, then this undervoltage or overvoltage condition is latched into a latch of the detecting compare-and-mask circuit, and the voltage on flag terminal 50 is pulled down to ground potential. The voltage on the open-drain flag terminal 50 is otherwise not pulled down, but rather is pulled up to the VDD by external pullup resistor 22. The low voltage (ground potential) on flag terminal 50 and conductor 77 constitutes an interrupt signal 78. This active low interrupt signal 78 is supplied via conductor 77 onto the active low interrupt input terminal 79 of microcontroller 34. The low interrupt signal therefore interrupts the microcontroller 34. The microcontroller 34 can respond to the interrupt, as further explained below, by accessing the power loss protection integrated circuit 6 via the two-wire I2C bus 80. The two conductors SDL and SDA are the two conductors of the I2C bus. The values of the lower voltage limit and the upper voltage limit for each of the eight channels is user programmable (changeable via the microcontroller 34 under software control) via the I2C interface of terminals 48 and 49. In the present example, the measurable voltage range on conductor 66 corresponds to a measured through-current flowing through the current switch 57 in the range of from zero amperes to six amperes. In the present example, the measurable voltage range on conductor 69 corresponds to a measured voltage on the VIN terminal in the range of from zero volts to twenty volts. In the present example, the measurable voltage range on conductor 71 corresponds to a measured storage capacitor voltage on the STR terminal in the range of from zero volts to thirty-six volts. In the present example, the measurable voltage range on conductor 72 corresponds to a measured on-chip temperature in the range of from minus forty degrees Celsius to plus one hundred and fifty degrees Celsius.

The health monitor circuit 59 also includes a capacitor health check circuit. The capacitor health check circuit includes a digital state machine. If the power loss protection integrated circuit 6 is not operating in the normal mode as indicated by the active high NORMAL_MODE digital signal on conductor 88, then the capacitor health check circuit is disabled. If, however, the power loss protection integrated circuit 6 has been operating in the normal mode for a least four minutes, at the conclusion of the four minute period the state machine disables the boost converter and enables a ten milliampere current source. The ten milliampere current source sinks current from the STR terminal 44. At the end of a time period determined by the programmable value TSET[3:0], the state machine disables the ten milliampere current source and enables a fifty milliampere current source that sinks current from the STR terminal 44. The fifty milliampere current source remains enabled for a period of time determined by the value TSET[3:0]. In one example, this time period is one tenth the period of time the ten milliampere current source was enabled. If at any time during the period of time when either of the two sinking current sources is enabled the voltage on the STR terminal 44 falls below a programmable voltage, then a latch is set. The programmable voltage is determined by the user programmable value THR[3:0]. The setting of the latch causes the voltage on the capacitor fault terminal CF 51 to be pulled down to ground potential. This is an indication of a capacitor fault condition. This active low fault signal may, for example, be supplied onto a second interrupt input terminal 87. In addition, the LED 28 is on during the time when then capacitor fault signal is asserted low.

The I2C interface and digital register control and digital state machine circuit 58 is a digital block that includes an I2C serial bus interface circuit and a digital state machine circuit. There are various digital registers disposed in various places across the integrated circuit. The digital outputs of various ones of the bits of these registers are coupled to various circuits in the integrated circuit so that the stored digital values will control and affect operation of the circuitry. Other selected bits of the registers are used to capture the digital states of corresponding nodes in the circuitry. The I2C interface is usable to read and to write to any selected one of these registers via the DATA conductors 81, the enable conductors 82, the R/W conductor 83 and the strobe conductor 84. The DATA conductor 81, the R/W conductor 83, and the strobe conductor 84 extend to all these registers. For each register, there is one dedicated enable conductor that extends from the I2C interface logic to an enable input lead of that register.

To write an 8-bit value into a particular register, the I2C interface places the data to be written onto the DATA conductors 81. Because the access is a write, the voltage on the R/W conductor 82 is driven to a digital logic low level. The enable conductors to all the registers are driven to be disabled (digital logic low), except for the one desired register that is to be written. The enable conductor to that register is driven with a digital logic high signal. After these signals are set up, the strobe signal on conductor 84 is pulsed high to clock the data into the enabled register. The 8-bit value stored in a particular register can be read by the I2C interface in similar fashion except that the I2C interface does not drive data out on the DATA conductors, but rather the I2C is setup to read in data from the DATA conductors. In addition, the digital logic value driven onto the R/W conductor is a digital logic high value. When the data bus conductors are set up this way, a pulsing of the strobe signal causes the enabled register to output its 8-bit value onto the 8-bit DATA bus, so that the 8-bit value will then be latched into the I2C interface logic. In this way, the I2C interface can read from, and can write to, any selected one of the registers on the integrated circuit.

Figure 3:
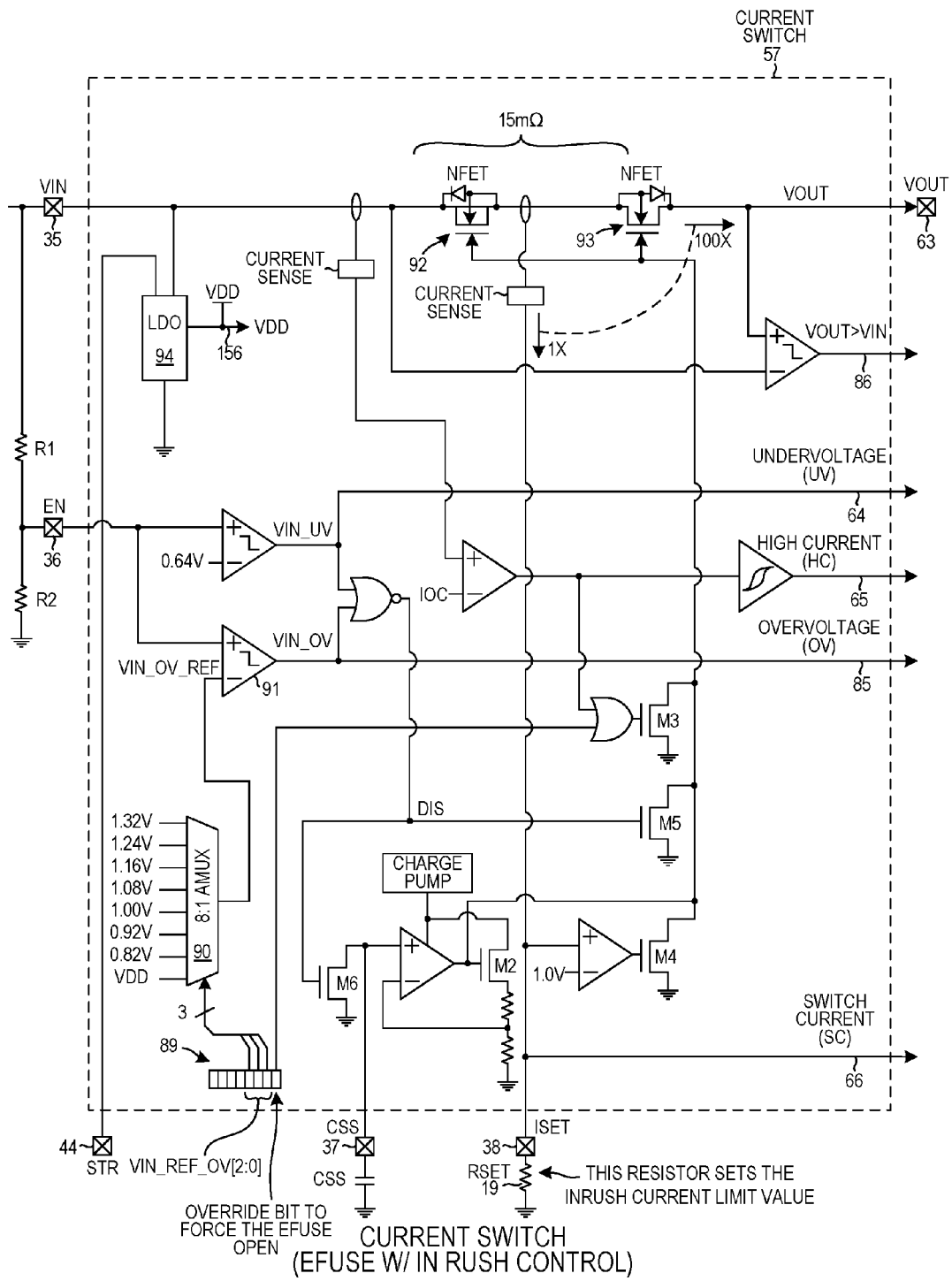
FIG. 3 is a more detailed diagram of the current switch circuit 57 of FIG. 2.

FIG. 3 is a more detailed diagram of the current switch circuit 57 of FIG. 2. The current switch circuit 57 includes an 8-bit register 89 that is accessible via the I2C interface and digital register control and digital state machine block 58 of FIG. 2. Three of the bits are a VIN_REF_OV[2:0] value. This 3-bit value is supplied onto the select inputs of the 8:1 analog multiplexer 90. The multiplexer determines the magnitude of a voltage VIN_OV_REF that is supplied onto an input lead of comparator 91. The voltage on the other input lead of comparator 91 is a voltage-divided version of the VIN voltage on the terminal 35. Accordingly, the 3-bit value is a programmable value that the voltage on the VIN terminal, above which the digital signal OV is asserted to indicate an overvoltage condition. The register 89 also includes a bit that is called an "override" bit. Setting this bit to a digital logic high forces the current switch circuit 57 to open (to disconnect and to decouple the VIN terminal from the VOUT terminal). The through-current flowing through the NFETs 92 and 93 is sensed and mirrored, and the mirrored smaller current is then converted into a SC voltage signal by passing the mirrored current across the RESET resistor 19. The voltage signal SC is directly proportional to the magnitude of the through-current passing through the NFETs. If there is a supply voltage present on either the VIN terminal or on the STR terminal, then the LDO 94 outputs a supply voltage VDD that is used throughout the integrated circuit.

Figure 4:
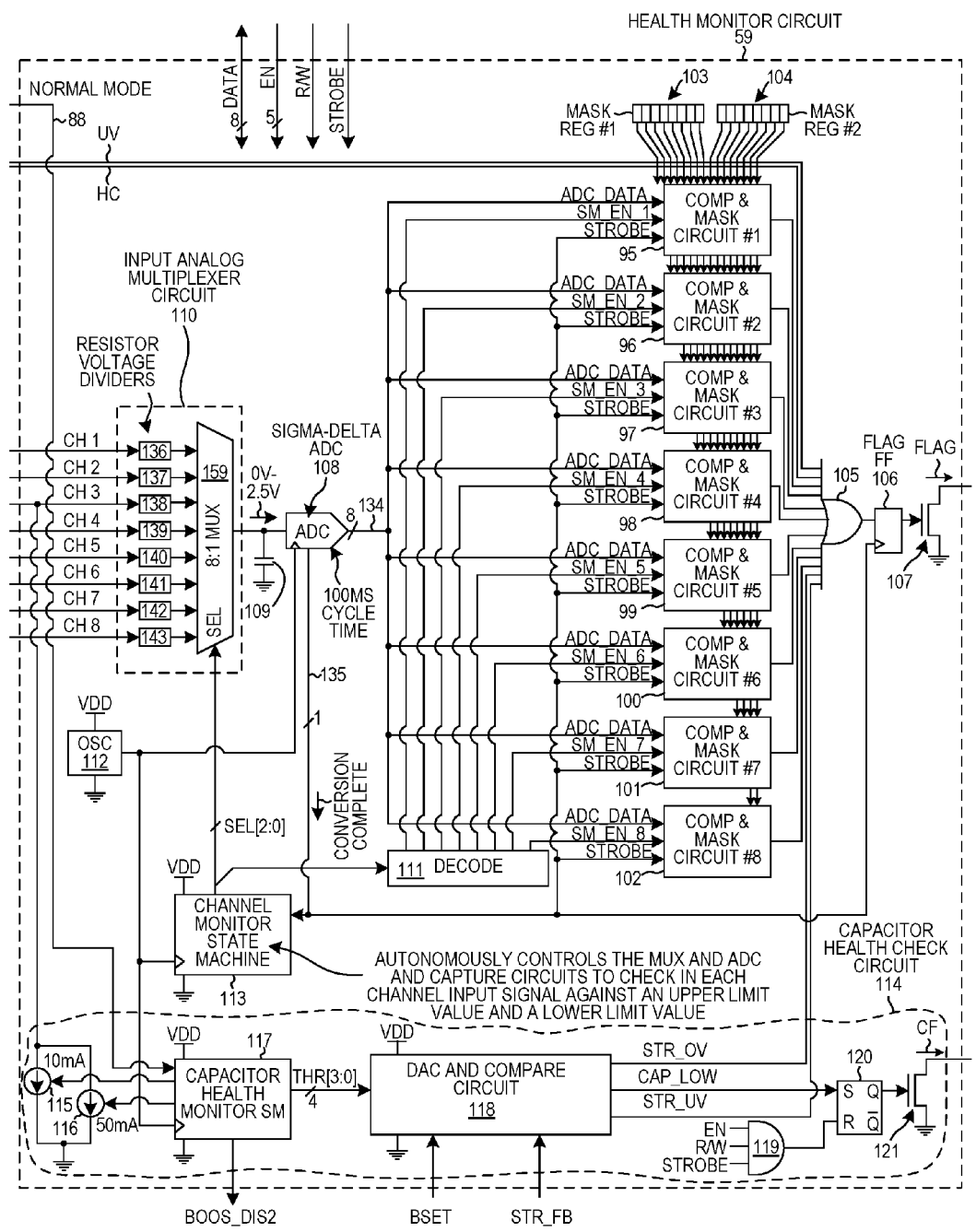
FIG. 4 is a more detailed diagram of the health monitor circuit 59 of FIG. 2.
Figure 5:
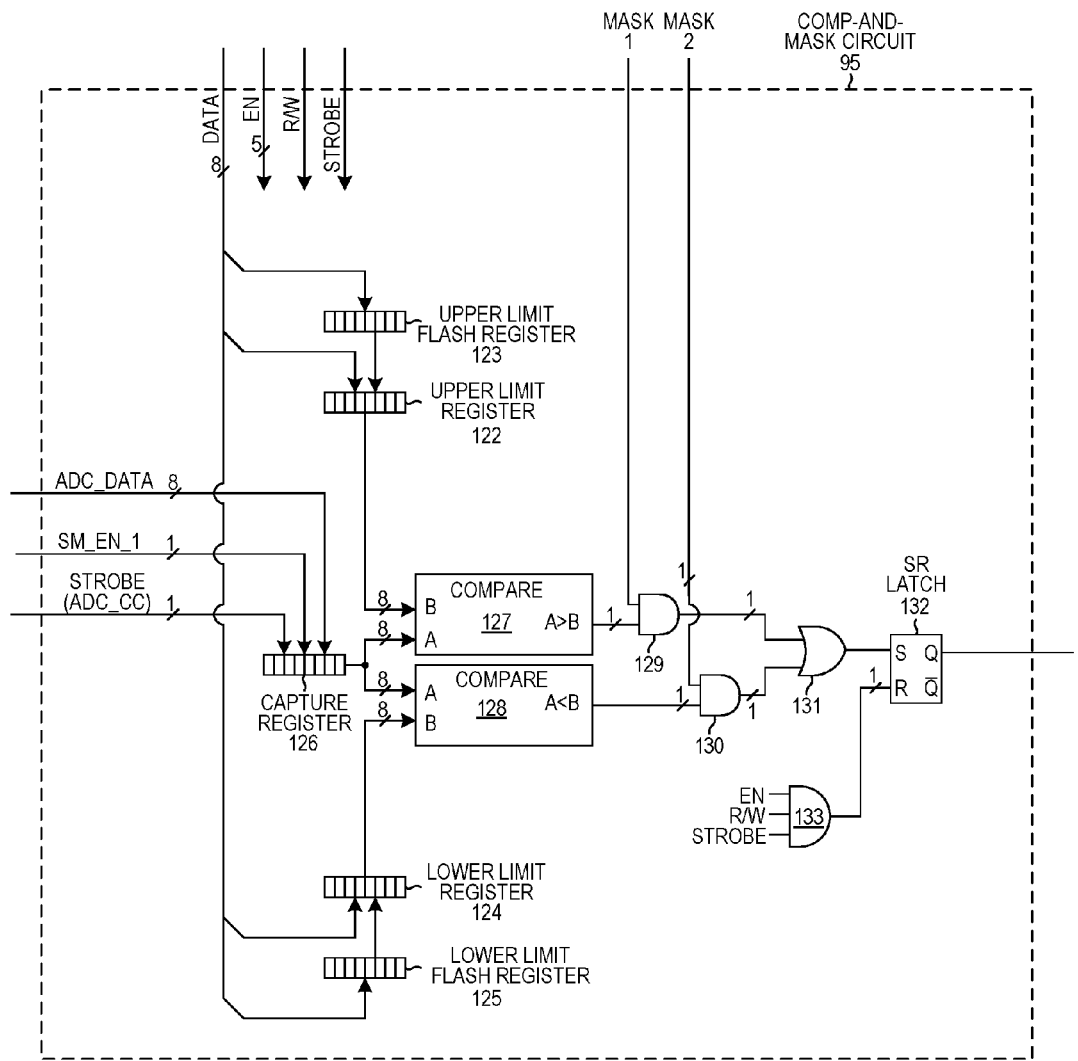
FIG. 5 is a more detailed diagram of a compare-and-mask circuit 95 within the health monitor circuit 59 of FIG. 4.
Figure 6:
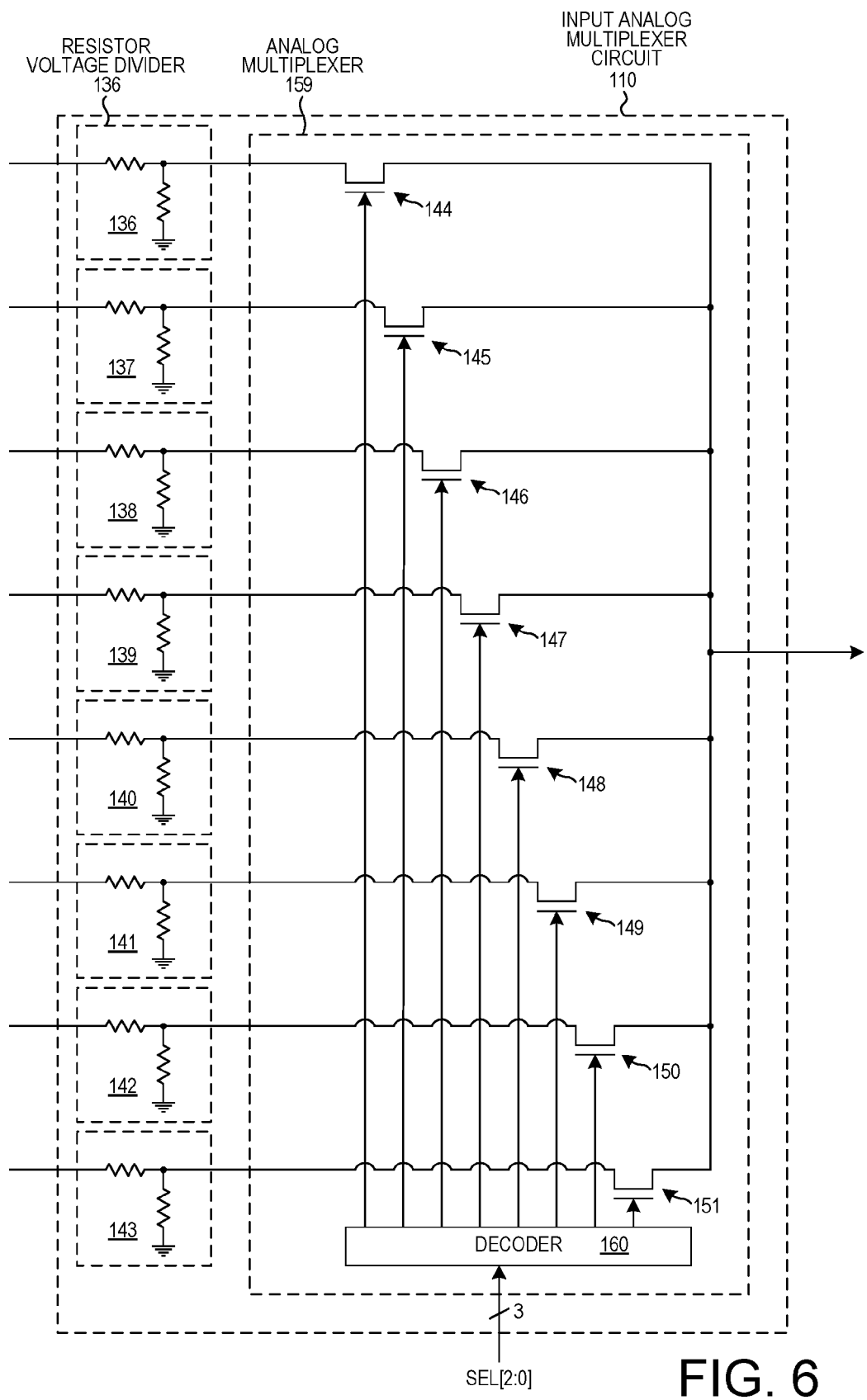
FIG. 6 is a more detailed diagram of the input analog multiplexer circuit 110 of the health monitor circuit 59 of FIG. 4.
Figure 7:
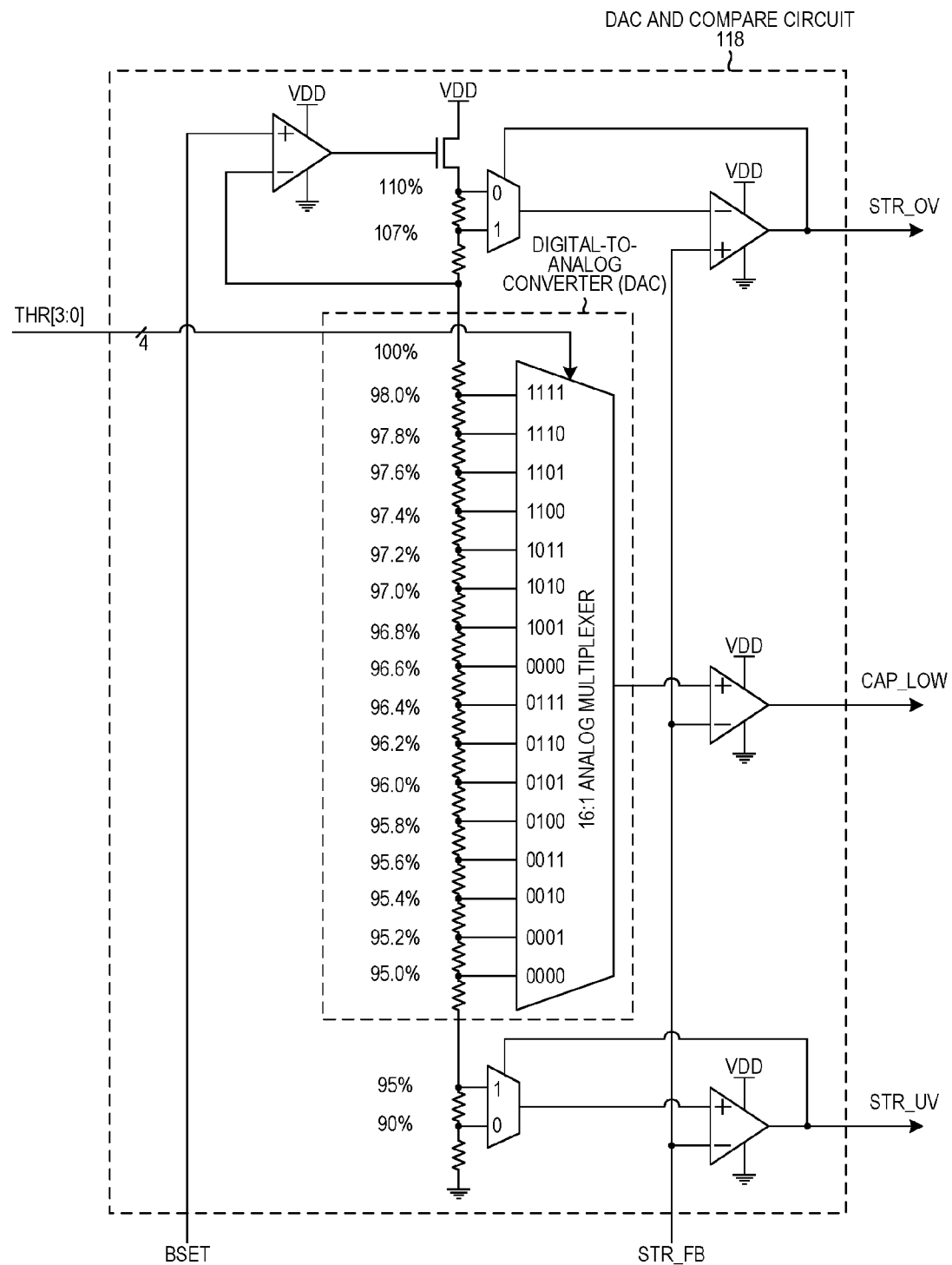
FIG. 7 is a more detailed diagram of the DAC and compare circuit 118 of the health monitor circuit 59 of FIG. 4.

FIG. 4 is a more detailed diagram of the health monitor circuit 59 of FIG. 2. The circuit of FIG. 4 includes eight compare-and-mask circuits 95-102, a first mask register 103, a second mask register 104, an OR gate 105, a flag flip-flop 106, a pull-down transistor 107, a sigma-delta ADC 108, a capacitor 109, an input analog multiplexer circuit 110, a decoder 111, a free-running on-chip RC relaxation oscillator 112, a channel monitor state machine 113, and a capacitor health check circuit 114. FIG. 5 is a more detailed diagram of one of the compare-and-mask circuits 95 of FIG. 4. FIG. 6 is a more detailed diagram of the input analog multiplexer circuit 110 of FIG. 4. The capacitor health check circuit 114 includes a ten milliampere current sink 115, a fifty milliampere current sink 116, a capacitor health monitor state machine 117, a DAC and compare circuit 118, an AND gate 119, an SR latch 120, and a pull-down transistor 121. FIG. 7 is a more detailed diagram of the DAC and compare circuit 118 of FIG. 4.

The structure of each of the compare-and-mask circuits is the same. As shown in FIG. 5, compare-and-mask circuit 95 includes an 8-bit upper limit register 122, an 8-bit upper limit FLASH register 123, an 8-bit lower limit register 124, an 8-bit lower limit FLASH register 125, an 8-bit capture register 126, two 8-bit digital comparators 127 and 128, masking AND gate 129, masking AND gate 130, OR gate 131, an SR latch 132, and a gate 133 that causes the SR latch to be reset. Each of the registers 122-125 can be individually written with eight bits of data via the I2C interface block 58 of FIG. 2. Each of the registers 122-126 can be read via the I2C interface block 58 of FIG. 2. Also, the mask registers 103 and 104 can be separately written with eight bits of data via the I2C interface block 58 of FIG. 2. A counter in the channel monitor state machine 113 of FIG. 4 counts up from 000 up to 111 and then rolls over. Accordingly, the 3-bit SEL[2:0] values increment from 000 up to 111, and then roll over back to 000, and this repeats. In this way, the digital state machine sequentially selects the compare-and-mask circuits, one at a time. The same selecting SEL[2:0] value is also supplied onto the select inputs of the input analog multiplexer circuit 110. Consequently, the input analog multiplexer circuit 110 selects analog voltages on its analog data input leads, one at a time. In the case of the first count SEL[2:0] being 000, the input analog multiplexer circuit is controlled to receive the analog voltage on the first data input (CH1), and to supply a corresponding analog voltage onto the input of the ADC 108. At the same time, the SEL[2:0] of 000 causes the first compare-and-mask circuit #1 95 to be selected. The ADC 108 performs an analog-to-digital conversion, and outputs an 8-bit digital value onto conductors 134. The conversion complete signal output by the ADC onto conductor 135 causes the 8-bit digital value to be clocked into the capture register (see FIG. 5) of the enabled first compare-and-mask circuit 95. A comparison is made by the compare-and-mask circuit as described below, and the new OR-ed result of all eight compare-and-mask circuits is clocked into the flag flip-flop 106 at the conclusion of the one hundred millisecond ADC conversion operation. The digital state machine 113 then increments the SEL[2:0] value, and this process is repeated, except the second channel (CH2) is selected and the ADC result is captured into the second compare-and-mask circuit 96. The voltage dividers 136-143 of the input analog multiplexer circuit 110 scale the input voltage ranges of the various channels such that the range of the multiplexed analog signal at the input of the ADC is in the 0 volt to 2.5 volt range. As shown in FIG. 6, the input analog multiplexer circuit 110, in addition to the eight voltage dividers 136-143, includes an analog multiplexer 159 made up of N-channel field effect transistors 144-151 and a decoder 160. The digital state machine 113 controls the overall circuit such that each successive input channel voltage conversion is captured into the capture register of each successive compare-and-mask circuit.

Figure 1:
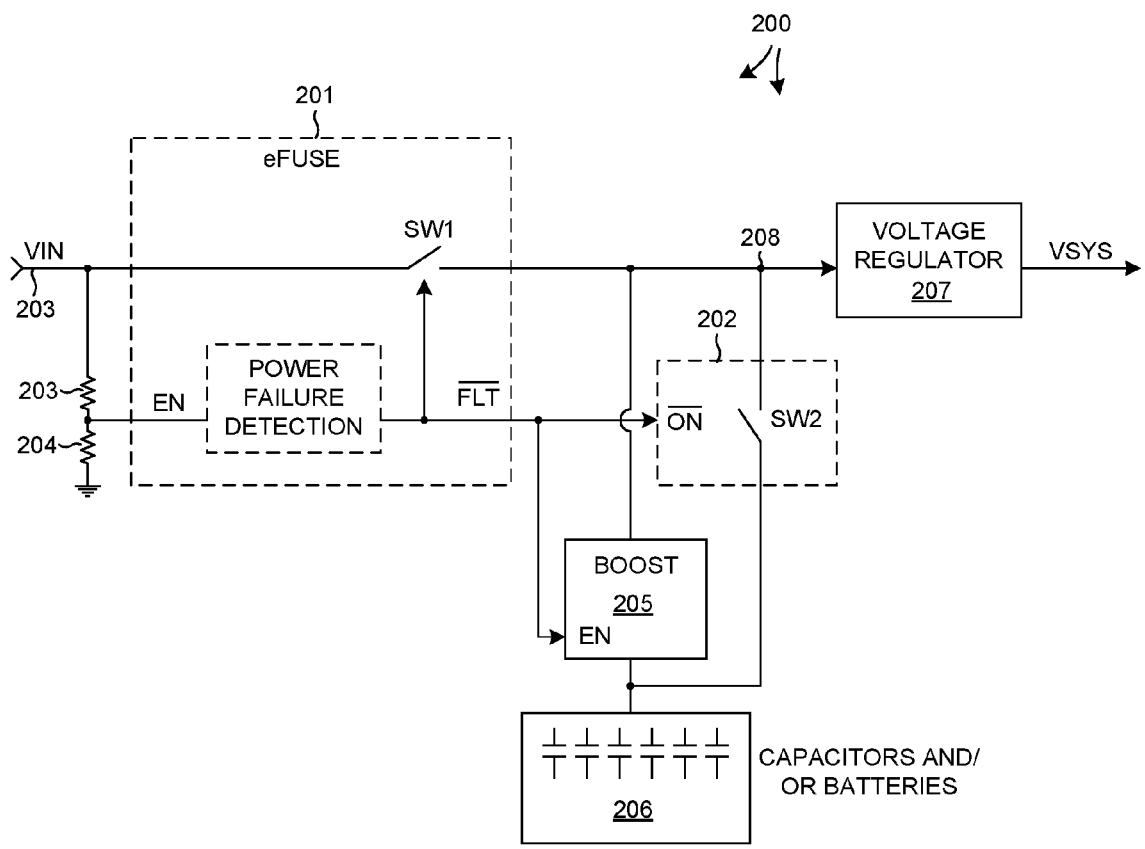
FIG. 1 is a diagram of an example of a power loss protection system.

Consider the case in which a given 8-bit ADC output value is clocked into the capture register 126 of FIG. 5. Comparator 127 compares the capture value to the value in the upper limit register 122. If the capture value is greater than the upper limit value, then a digital logic high is output by the comparator 127. Comparator 128 compares the capture value to the value in the lower limit register 12. If the capture value is smaller than the lower limit value, then a digital logic high is output by the comparator 128. Each of the comparator output can be separately and independently masked by setting an corresponding bit in the appropriate mask registers. If both of the mask bits MASK1 and MASK2 of FIG. 5 are digital logic highs, however, there is no masking. OR gate 131 outputs a digital logic high value if the capture value is detected to be either lower than the lower limit value or if it is higher than the upper limit value. If the output of the OR gate 131 is a digital logic high, then the SR latch 132 is set. Otherwise it is not set. The setting of the SR latch 132 indicates a condition of the capture value being out of the range between the upper limit value and the lower limit value. As seen in the circuit diagram of FIG. 4, the outputs of all of the eight SR latches of the eight compare-and-mask circuits are ORed by OR gate 105, and if one or more of the ST latches are set, then the flag flip-flop 106 is set at the end of the conversion cycle. The setting of the flag flip-flop 106 causes the pull-down transistor 107 to be turned on, which in turns causes the interrupt signal 78 (see FIG. 1) to be asserted, which in turn interrupts the microcontroller 34. The microcontroller 34 responds to the interrupt by reading one or more registers within the power loss protection integrated circuit 6 via the I2C block 58. In the present example, the microcontroller causes the I2C block 58 to read the 8-bit capture value in register 126. The 8-bit value is returned to the I2C block 58 via the DATA lines 81, and then the 8-bit value is communicated back across the I2C bus 80 to the microcontroller 34. The gate 133 within the compare-and-mask circuit that was read detects that its capture register is being read, and this causes the gate 133 to pulse a digital logic high pulse onto the reset input of the SR latch 132. This clears (resets) the latch. One of the registers (not shown) of the integrated circuit is a read-only register consisting of the eight SR latch values, considered together as an 8-bit value. The microcontroller 34 can read this one "register" and thereby obtain the values of the eight SR latches. From this information, the microcontroller 34 can determined which one of the eight compare-and-mask circuits it was that caused the fault. From this information, the microcontroller 34 can read the capture register of that compare-and-mask circuit, thereby obtaining the 8-bit capture value and at the same time resetting the SR latch.

Note that the undervoltage signal UV and the high current signal HC are supplied to inputs leads of the OR gate 105 of FIG. 4. An undervoltage condition or a high current condition will also cause the flag flip-flop 106 to be set.

The capacitor health check circuit 114 has its own controlling state machine 117. If the overall integrated circuit is not operating in the normal mode as indicated by the digital signal NORMAL_MODE on conductor 88, then the state machine 177 prevents the capacitor health check circuit 114 from performing an capacitor health check operation. If, on the other hand, the overall integrated circuit is operating in the normal mode as indicated by the digital signal NORMAL_MODE on conductor 88, then at end of each four period the state machine 177 disables the converter from operating in the boost mode by asserting the BOOST_DIS2 signal, and enables the ten milliampere current sink 115. The current drain of this current sinking from the STR terminal causes the voltage on the external capacitor bank 11 to decrease. This current drain condition is maintained for a period of time determined by a 4-bit TSET[3:0] value in a register of the capacitor health check circuit. At the end of this time period, the state machine 117 disables the ten milliampere current sink and simultaneously enables the fifty milliampere current sink 116. The fifty milliamperes current sink 116 then draws more current from the external capacitor bank 11 via terminal STR. This condition persists for one tenth of the time period through which the ten milliampere current source was enabled. If at any time during these two time periods the DAC and compare circuit 118 detects that the voltage on the STR terminal has fallen below a programmable voltage, then the CAP_LOW digital signal is asserted and the SR latch 120 is set. The setting of the SR latch 120 indicates a capacitor fault condition. The pull-down transistor 121 is turned on, and the capacitor fault signal CF is asserted low. The programmable voltage is set, via the I2C interface block 58, by setting the 4-bit value THR[3:0] in a programmable register (not shown) of the capacitor health check circuit 114. The signal STR_FB coming into the DAC and compare circuit 118 of FIG. 7 is a voltage-divided version of the voltage on the STR terminal 44. If the voltage on the STR terminal is detected during these two periods as having gone below an STR undervoltage value STR_UV, then the DAC and compare circuit 118 of FIG. 7 asserts the STR_UV digital signal and this signal is communicated to the OR gate 105 of FIG. 4, which in turn causes the flag signal on flag terminal 50 to be asserted low. If the voltage on the STR terminal is detected during these two periods as having gone above an STR overvoltage value STR_OV, then the DAC and compare circuit 118 of FIG. 7 asserts the STR_OV digital signal and this signal is communicated to the OR gate 105 of FIG. 4, which in turn causes the flag signal on flag terminal 50 to be asserted low. The value of the SR latch 120 can be read via the I2C block 58 in the same way that the SR latches of the compare-and-mask circuits 95-102 can be read. The reading of the SR larch 120 is detected by AND gate 119, which causes the SR latch 120 to be reset at the end of the reading. In FIG. 7, the notation "110%" on a node of the voltage divider indicates that the voltage on that node is 110 percent of the voltage VDD, the notation "107%" on a node indicates that the voltage on that node is 107 percent of the voltage VDD, and so forth.

Figure 8:
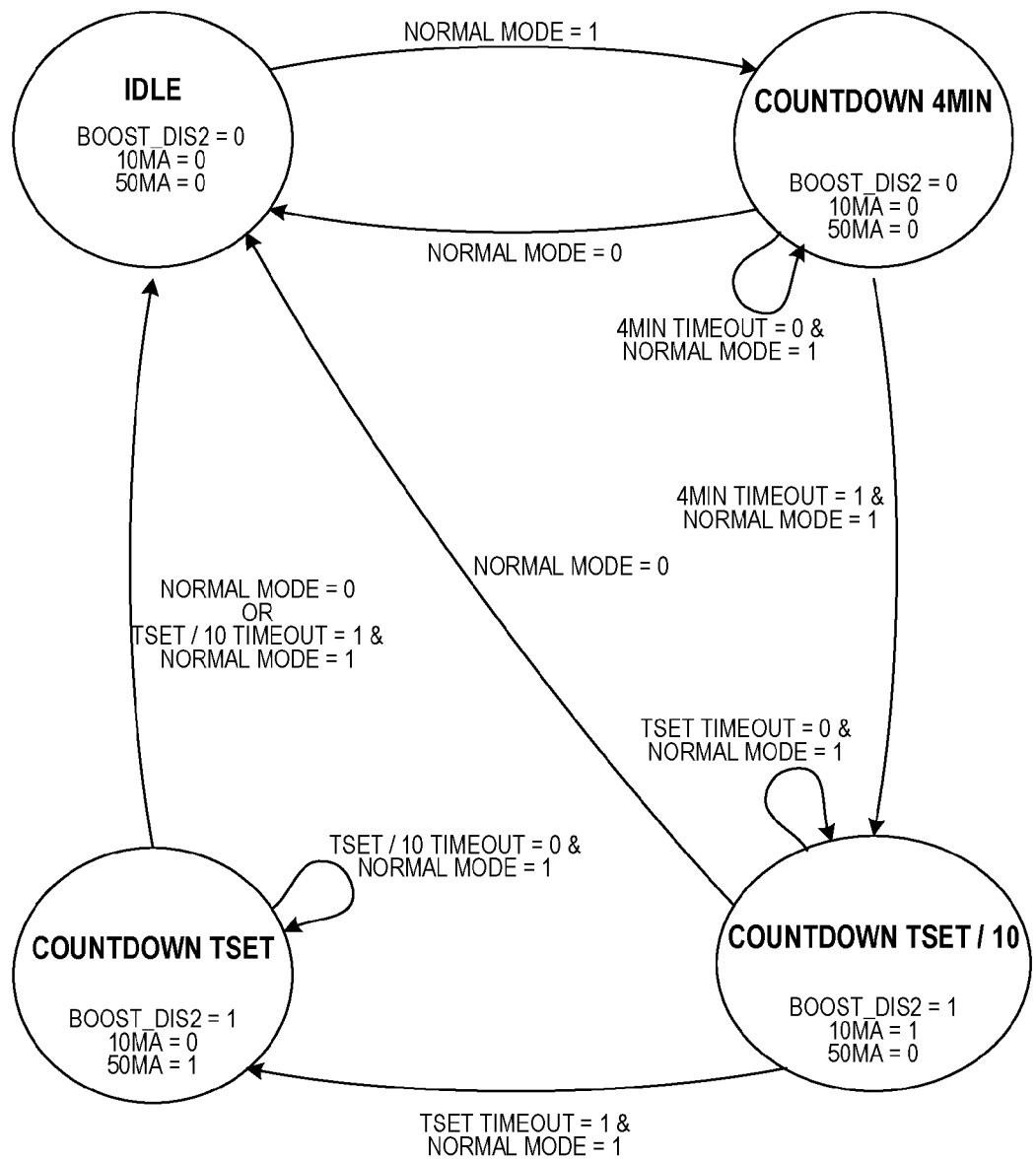
FIG. 8 is a state diagram for the capacitor health monitor state machine 117 of FIG. 4.

FIG. 8 is a state diagram that sets forth the operation of the capacitor health monitor state machine 117 of the capacitor health check circuit 114. The signal name assignments in each state indicate the state to which the state machine forced that signal when the state machine is in that state. For example, in the IDL state, the notations "BOOST_DIS2=0", "10MA=0" and "50MA=0" indicate that the digital signal BOOST_DIS2 is forced to be a digital logic low, and the ten milliampere current sink is disabled, and the fifty milliampere current sink is disabled.

Figures 9, 10:
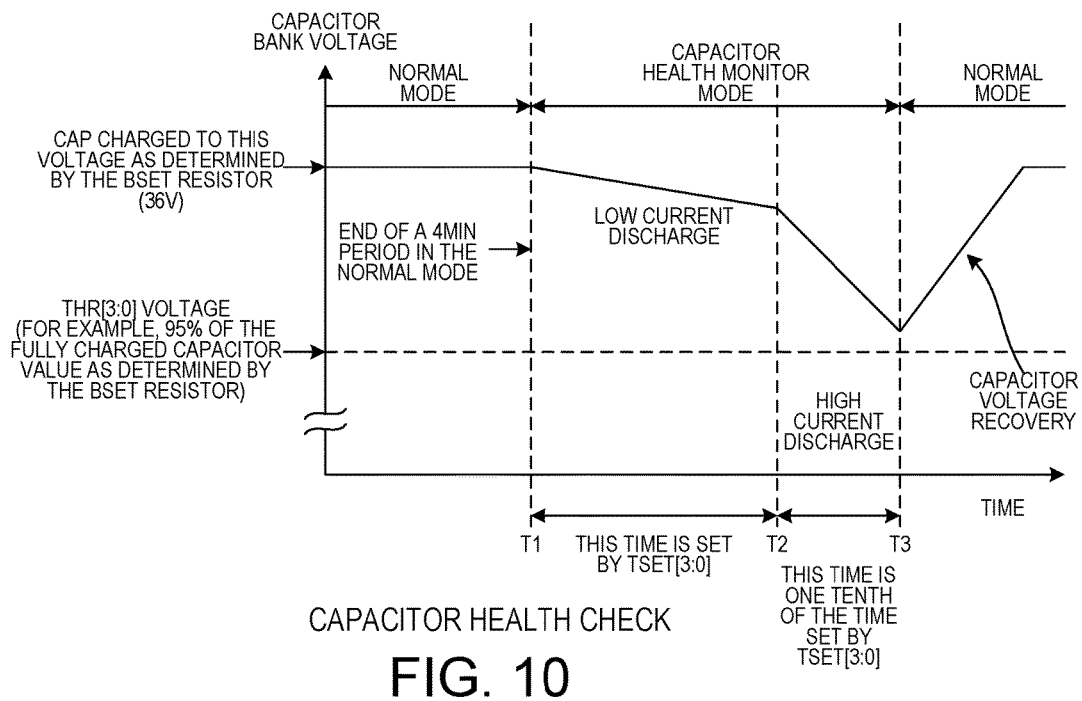
FIG. 9 is a table that indicates, for each 4-bit TSET[3:0] value, the corresponding time period throughout which the ten milliampere current sink 115 of the health monitor circuit 114 of FIG. 4 is enabled during a capacitor health check operation.
FIG. 10 is a timeline diagram that illustrates one capacitor health check operation as carried out by the capacitor health check circuit 114 of FIG. 4.

FIG. 9 is a table that indicates, for each 4-bit TSET[3:0] value, the corresponding time period throughout which the ten milliampere current sink is enabled.

FIG. 10 is a diagram that illustrates one capacitor health check operation as carried out by the capacitor health check circuit 114. Time T1 is the end of a four minute period during which the overall integrated circuit has been operating in the normal mode, and during which the boost converter has been enabled. Due to the boost converter having been enabled this long, the capacitor bank 11 should be fully charged to the voltage level set by the resistor RBSET 19. In the present example, this is 36 volts. At time T1, the capacitor health monitor state machine 117 disables the boost converter (by asserting BOOST_DIS2) and enables the ten milliampere current sink 115. The ten milliampere current sink 115 remains enabled for the time period determined by the TSET[3:0] value. This period of time ends at time T2. The state machine 117 then disables the ten milliampere current sink 115 and enables the fifty milliampere current sink 116. This condition of having the fifty milliampere current source enabled persists for one tenth of the TSET determined time. The diagram of FIG. 10 is not drawn to scale. This second period of time ends at time T3. The CF signal on terminal 51 may be asserted at any time between time T1 and time T3. Once it is asserted low, it remains asserted low due the setting of SR latch 120. At time T3, the capacitor health check operation is over, and the overall integrated circuit resumes operating in the normal mode. This means that the boost converter resumes operation. The capacitor bank 11 is therefore charged back up to the fully charged capacitor voltage (in this case, 36 volts).

Figure 11:
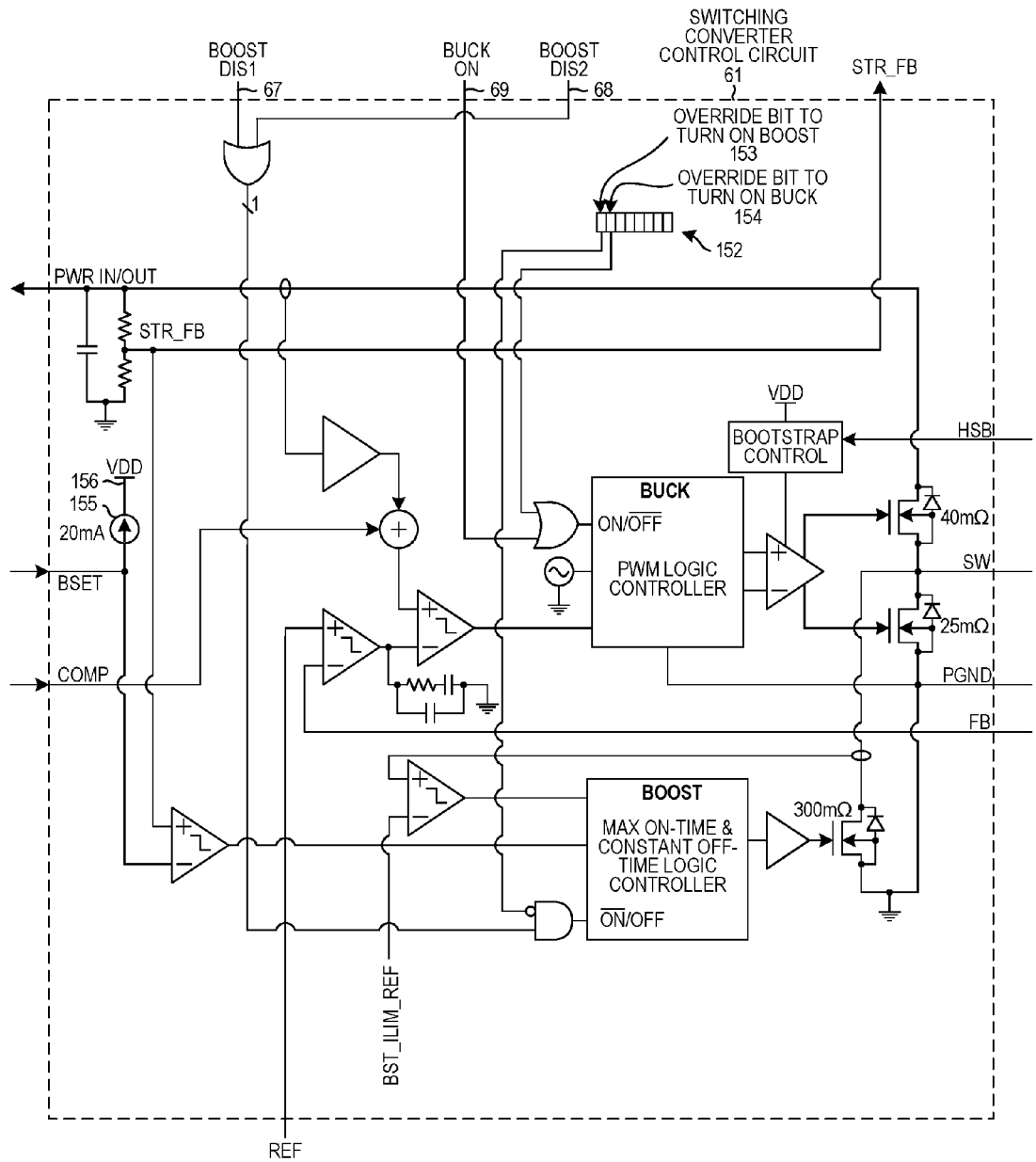
FIG. 11 is a more detailed diagram of the switching converter control circuit 61 of FIG. 1.

FIG. 11 is a diagram of the switching converter control circuit 61 of FIG. 2. In the boost mode of operation, the controller 61 and the external components 20, 21, 23-27 operate as a boost converter. The relatively low DC voltage on terminal 63 and external capacitor 21 is boosted up to a relative high voltage (for example, 36 volts DC), which is driven out onto the STR terminal 44 so as to charge the capacitor bank 11 up to the relatively high voltage. In the buck mode of operation, the controller 61 and the external components 20, 21, 23-27 operate as a buck converter. The relatively high voltage on capacitor bank 11 and the STR terminal 44 is bucked down to a relatively low DC voltage. This relatively low voltage is driven onto the VOUT terminal 63 and external capacitor 21. The magnitude of the relatively low voltage, which in the present example is 3.3 volts, is set by the external resistors 25 and 26 (see FIG. 2). Advantageously, the same inductor 24 is used in both the boost mode and in the buck mode. The switching converter control circuit 61 of FIG. 11 includes an 8-bit register 152. The microcontroller 34 can write an 8-bit value into this 8-bit register 152 via the I2C bus 80 and the I2C interface block 58. The register 152 includes an override bit 153. When this bit is set, the boost converter is forced on. The register 152 also includes override bit 154. When this bit is set, the buck converter is forced on. If set, either of these override bits takes precedence over the BOOST_DIS1 signal, the BUCK_ON signal, the BOOST_DIS2 signal, and normal mode operation of the circuit 61. It is an illegal condition that both these override bits 153 and 154 to be set at the same time.

The magnitude of the relatively high voltage to which the converter boosts in the boost mode is user programmable, and is set by providing only one external resistor RBESET 19 of the appropriate resistance. The magnitude of the resistance of this one FBSET resistor corresponds directly to the magnitude of the relatively high voltage to which the STR terminal is driven in the boost mode. The relatively high voltage to which the STR terminal is driven in the boost mode is a gained-up version of the voltage on the BSET terminal 45. If no external resistor RBSET is provided, then a twenty microampere current source 155 pulls the voltage on BSET terminal 45 up to the LDO voltage level VDD of the VDD supply bus and node 156.

Figure 12:
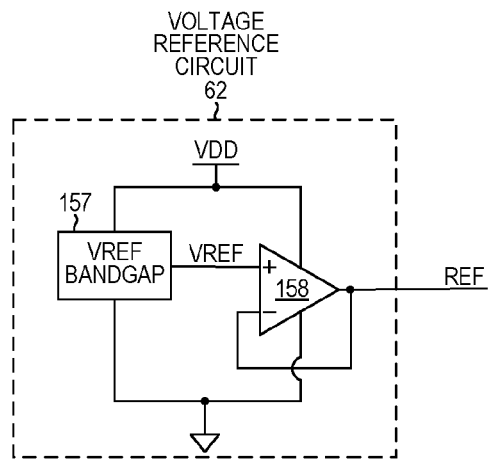
FIG. 12 is a more detailed diagram of the voltage reference circuit 62 of FIG. 2.

FIG. 12 is a more detailed diagram of the voltage reference circuit 62 of FIG. 2. The voltage reference circuit 62 includes a bandgap voltage reference 157 and a comparator 158.

Figure 13:
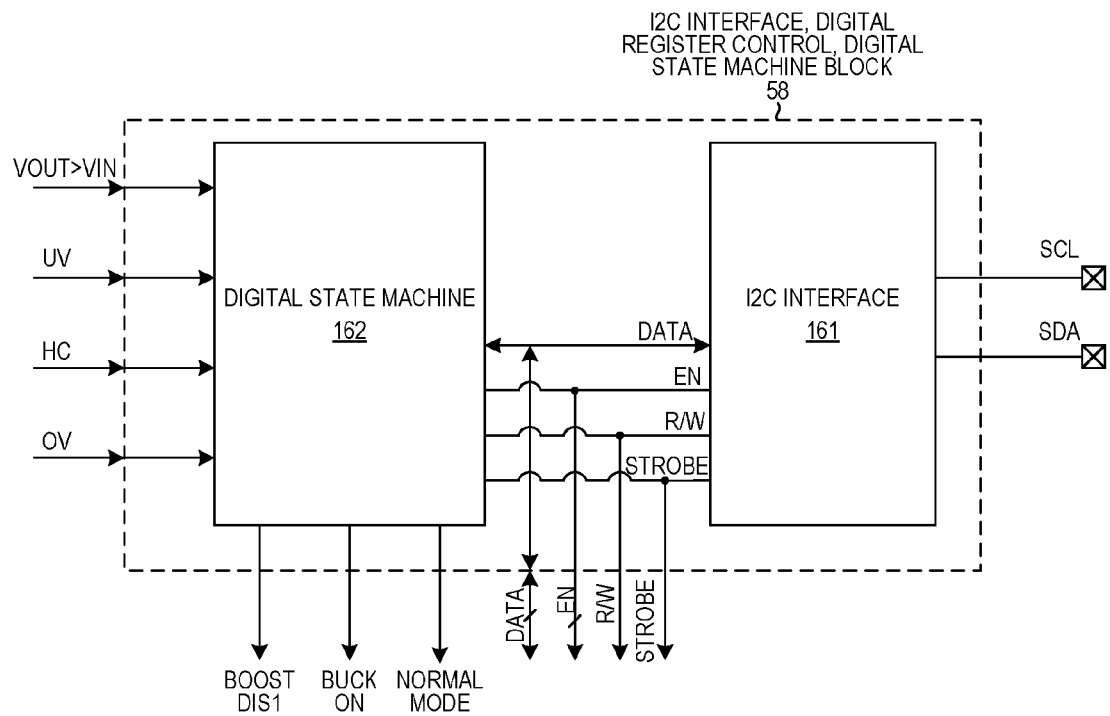
FIG. 13 is a more detailed block diagram of the I2C interface and digital register control and digital state machine block 58 of FIG. 2.

FIG. 13 is a block diagram of the I2C interface and digital register control and digital state machine circuit 58 of FIG. 2. The block 58 includes an I2C interface portion 161 and a digital state machine portion 162.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. An integrated circuit, comprising:
   a first terminal;
   a second terminal;
   a current switch circuit that can receive a current of up to a maximum input current from the first terminal, wherein the current switch circuit can conduct a through-current from the first terminal, through the current switch circuit to the second terminal with a small resistance, and wherein the current switch circuit outputs a current sense voltage whose magnitude is indicative of a magnitude of a current flowing through the current switch circuit;
   an input analog multiplexer circuit having a first analog input lead, a second analog input lead, at least one select input lead, and an analog output lead, wherein the first analog input lead is coupled to receive the current sense voltage, wherein the second analog input lead is coupled to receive an input voltage, and wherein the input voltage can have a magnitude of up to a maximum input voltage;

an Analog-to-Digital Converter (ADC) that is coupled to the output lead of the input analog multiplexer circuit, wherein the ADC is adapted to output a first digital value indicative of a magnitude of the current flowing through the current switch circuit, and wherein the ADC is adapted to output a second digital value indicative of a magnitude of the input voltage;

a first comparator circuit adapted to compare the first digital value to a first limit value and to output a first comparison signal indicative of the comparison;

a second comparator circuit adapted to compare the second digital value to a second limit value and to output a second comparison signal indicative of the comparison;

a third terminal adapted to output a flag signal, wherein the flag signal is indicative of a condition in which either the first comparison signal is asserted or the second comparison signal is asserted; and a digital logic circuitry adapted to control the input analog multiplexer circuit by driving a digital logic signal onto the select input lead of the input analog multiplexer circuit, wherein the digital logic circuitry is powered from a digital logic supply voltage, and wherein the digital logic supply voltage is a voltage smaller than the maximum input voltage.

2. The integrated circuit of claim 1, further comprising:
a first limit register adapted to store the first limit value;
a second limit register adapted to store the second limit value;
a first capture register adapted to store the first digital value; and
a second capture register adapted to store the second digital value, wherein the maximum input current is at least two amperes, wherein the through-current is two amperes, wherein the small resistance is less than one ohm, and wherein the integrated circuit does not include a processor that fetches, decodes and executes instructions.

3. The integrated circuit of claim 1, wherein the first terminal is adapted to receive the input voltage onto the integrated circuit, and wherein the first terminal is coupled to the second analog input lead of the input analog multiplexer circuit.

4. The integrated circuit of claim 1, further comprising:
a fourth terminal, wherein the fourth terminal is adapted to receive the input voltage onto the integrated circuit, and wherein the fourth terminal is coupled to the second analog input lead of the input analog multiplexer circuit.

5. The integrated circuit of claim 1, wherein the current of which the current sense voltage is indicative is a current received by the current switch circuit from the first terminal.

6. The integrated circuit of claim 1, wherein the current of which the current sense voltage is indicative is a current output by the current switch circuit.

7. The integrated circuit of claim 1, wherein the current of which the current sense voltage is indicative is a current supplied by the current switch circuit to the second terminal.

8. The integrated circuit of claim 2, further comprising:
a third limit register, wherein the first comparator circuit is also adapted to compare the value stored in the first capture register to a value stored in the third limit register, and wherein the first comparison signal is asserted if either: 1) the value stored in the first capture register is greater than the value stored in the first limit register, or 2) the value stored in the first capture register is smaller than the value stored in the third limit register.

9. The integrated circuit of claim 1, wherein the input analog multiplexer circuit comprises:
a first resistor voltage divider circuit;
a second resistor voltage divider circuit; and
an analog multiplexer having a first data input lead, a second data input lead, a select input lead, and an output lead, wherein the first data input lead is coupled to the first resistor voltage divider circuit, and wherein the second data input lead is coupled to the second resistor voltage divider circuit.

10. The integrated circuit of claim 1, further comprising:
a fourth terminal; and
a switching converter control circuit adapted to output a direct current supply voltage onto the fourth terminal, wherein the fourth terminal is coupled to a third analog input lead of the input analog multiplexer circuit.

11. The integrated circuit of claim 2, further comprising:
a serial bus interface circuit, wherein the serial bus interface circuit is operable to read the value stored in the first capture register and to cause the value to be output from the integrated circuit in serial fashion across a serial bus, and wherein the serial bus interface circuit is operable to read the value stored in the second capture register and to cause the value to be output from the integrated circuit in serial fashion across the serial bus.

12. The integrated circuit of claim 1, wherein the first comparator circuit comprises a first latch that outputs the first comparison signal, and wherein the second comparator circuit comprises a second latch that outputs the second comparison signal.

13. An integrated circuit, comprising:
a first terminal;
a second terminal;
an eFuse circuit that can receive a current from the first terminal and can conduct the current to the second terminal;
an autonomous limit checking circuit comprising an input analog multiplexer circuit, an Analog-to-Digital Converter (ADC) coupled to an output lead of the input analog multiplexer circuit, a digital state machine that controls the input analog multiplexer circuit, and a plurality of compare-and-mask circuits, wherein each compare-and-mask circuit comprises a capture register, a lower limit register, and an upper limit register, wherein the compare-and-mask circuit is adapted to compare a digital value stored in its capture register to a lower limit value stored in its lower limit register and to compare the digital value stored in its capture register to an upper limit value stored in its upper limit register, wherein the compare-and-mask circuit is adapted to assert a digital output signal indicative of a comparison performed by the compare-and-mask circuit; and
a third terminal, wherein a digital signal is asserted onto the third terminal if any of the compare-and-mask circuits asserts its digital output signal.

14. The integrated circuit of claim 13, wherein a first analog input lead of the analog input multiplexer circuit is coupled to receive a voltage-divider divided down version of a voltage present on the first terminal, and wherein a second analog input lead of the analog input multiplexer circuit is coupled to receive a voltage whose magnitude is proportional to a current flowing through the eFuse circuit.

15. The integrated circuit of claim 13, wherein the digital state machine is powered from a digital supply voltage, and wherein the voltage present on the first terminal can be substantially larger than the digital supply voltage.

16. The integrated circuit of claim 13, wherein the autonomous limit checking circuit further comprises a mask register, and wherein a bit of the mask register being set causes a comparison performed by one of the compare-and-mask circuits to be masked.

17. The integrated circuit of claim 13, further comprising:
a serial data bus interface, wherein the serial data bus interface is usable by external circuitry to read a selected capture register of the autonomous limit checking circuit.

18. The integrated circuit of claim 17, where each compare-and-mask circuit has a bit that stores a value indicative of a comparison performed by the compare-and-mask circuit, wherein a reading of the selected capture register causes the bit of the compare-and-mask circuit that includes the selected capture register to be reset, and wherein the integrated circuit does not include a processor that fetches, decodes and executes any instructions.

19. The integrated circuit of claim 13, wherein the input analog multiplexer circuit comprises a plurality of resistor voltage dividers.

20. The integrated circuit of claim 13, wherein the input analog multiplexer circuit comprises a plurality of resistor voltage dividers.

21. An integrated circuit, comprising:
a first terminal;
a second terminal;
an eFuse means for receiving a current from the first terminal and conducting that current to the second terminal in a non-fault condition, and for opening in a fault condition such that there is no current flow through the eFuse means between the first terminal and the second terminal in the fault condition;
means for autonomously limit checking a plurality of voltages, and for generating a digital value indicative of a magnitude of each such voltage, and for each such voltage comparing the corresponding digital value to an upper limit value and comparing the corresponding digital value to a lower limit value, and for asserting a digital output signal indicative of a comparison pertaining to the corresponding digital value, wherein the means for limit checking generates multiple such digital output signals; and
a third terminal, wherein a digital signal is asserted onto the third terminal by the means for limit checking if any of the multiple such digital output signals is asserted.

22. The integrated circuit of claim 21, further comprising:
an upper limit register adapted to store the upper limit value; and
a lower limit register adapted to store a lower limit value, wherein the integrated circuit does not include a processor that fetches, decodes and executes any instructions.

* * * * *